(12) United States Patent
Fan

(10) Patent No.: US 12,109,626 B2
(45) Date of Patent: Oct. 8, 2024

(54) COATED CUTTING TOOL

(71) Applicant: TUNGALOY CORPORATION, Fukushima (JP)

(72) Inventor: Cangyu Fan, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 204 days.

(21) Appl. No.: 17/687,726

(22) Filed: Mar. 7, 2022

(65) Prior Publication Data

US 2022/0331881 A1 Oct. 20, 2022

(30) Foreign Application Priority Data

Apr. 12, 2021 (JP) ................. 2021-067183

(51) Int. Cl.
| | |
|---|---|
| *B23B 27/14* | (2006.01) |
| *C23C 16/36* | (2006.01) |
| *C23C 16/40* | (2006.01) |
| *C23C 28/04* | (2006.01) |
| *B23C 5/16* | (2006.01) |

(52) U.S. Cl.
CPC ............ *B23B 27/148* (2013.01); *C23C 16/36* (2013.01); *C23C 16/403* (2013.01); *C23C 28/042* (2013.01); *C23C 28/044* (2013.01); *B23B 2224/04* (2013.01); *B23B 2224/32* (2013.01); *B23B 2228/105* (2013.01); *B23C 5/16* (2013.01)

(58) Field of Classification Search
CPC ............ B32B 27/148; B32B 2228/105; B32B 2224/04; B32B 2224/32; C23C 16/36; C23C 16/403; C23C 16/0272; C23C 28/042; C23C 28/044; C04B 41/009; C04B 41/52; C04B 41/89; B23C 5/16; B23B 27/148
See application file for complete search history.

(56) References Cited

U.S. PATENT DOCUMENTS

2007/0172675 A1* 7/2007 Omori ................. C23C 30/005
   428/701
2010/0323176 A1  12/2010 Van Den Berg et al.
(Continued)

FOREIGN PATENT DOCUMENTS

| JP | 2011-516722 A | 5/2011 |
|---|---|---|
| JP | 2020-506811 A | 3/2020 |

*Primary Examiner* — Kevin C T Li
(74) *Attorney, Agent, or Firm* — Studebaker & Brackett PC

(57) ABSTRACT

A coated cutting tool, comprising: a substrate; and a coating layer formed on a surface of the substrate, wherein the coating layer includes a lower layer and an upper layer in this order from a substrate side toward a surface side, and the upper layer is formed on a surface of the lower layer, the lower layer contains a compound having a composition represented by $(Al_xTi_{1-x})N$, an average thickness of the lower layer is 1.0 μm or more and 15.0 μm or less, the upper layer contains an $\alpha\text{-}Al_2O_3$ layer containing $\alpha\text{-}Al_2O_3$, an average thickness of the upper layer is 0.5 μm or more and 15.0 μm or less, and in grains of the $\alpha\text{-}Al_2O_3$ layer, a proportion of grains of which a grain size is 0.05 μm or more and less than 0.5 μm is 50% by area or more and 80% by area or less.

20 Claims, 1 Drawing Sheet

(56) References Cited

U.S. PATENT DOCUMENTS

2015/0158094 A1* 6/2015 Igarashi .............. C23C 16/0272
                                                      427/249.19
2019/0262906 A1* 8/2019 Satoh ...................... B23B 51/00
2020/0002819 A1   1/2020 Stiens et al.

* cited by examiner

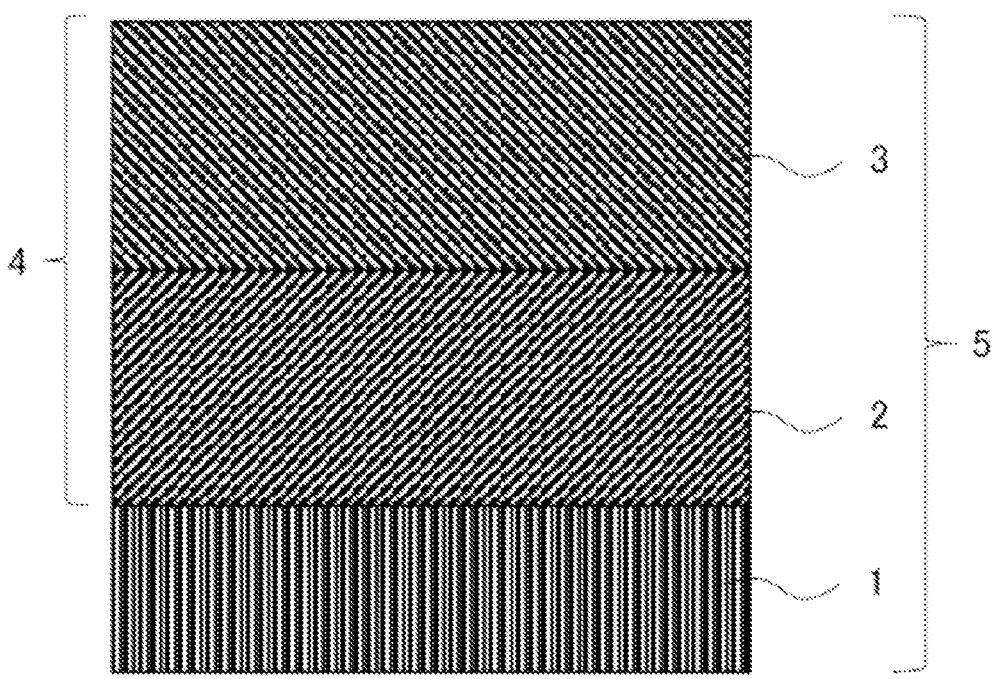

COATED CUTTING TOOL

BACKGROUND OF THE INVENTION

Field of the Invention

The present invention relates to a coated cutting tool.

Description of Related Art

It is conventionally well known that coated cutting tools obtained by vapor deposition forming, on a surface of a substrate made of a cemented carbide, a coating layer with a total thickness of 3 µm to 20 µm by chemical vapor deposition, are used for cutting steel, cast iron, and the like. A known example of the coating layer is a coating layer made of a single layer of one kind selected from a group consisting of carbide, nitride, carbonitride, oxycarbide and oxicarbonitride, of Ti, and aluminum oxide ($Al_2O_3$), or made of a plurality of layers of two or more kinds selected therefrom.

There also is known coated cutting tools obtained by vapor deposition forming a Ti—Al complex nitride layer by physical vapor deposition on a surface of a substrate made of a cemented carbide or a cubic boron nitride sintered body, and these are known to exhibit excellent wear resistance. However, while the conventional coated cutting tools obtained by forming a Ti—Al complex nitride layer by physical vapor deposition have relatively favorable wear resistance, cracks readily occur in a case of using in working under high-speed and intermittently-loaded cutting conditions, and accordingly various proposals have been made for improvement in the coating layer.

For example, Japanese Translation of PCT Application No. 2011-516722 discloses a body coated with a hard material, having a plurality of layers applied by CVD, with an $Al_2O_3$ layer being disposed as an outer layer on a $Ti_{1-x}Al_xN$ layer and/or a $Ti_{1-x}Al_xC$ layer and/or a $Ti_{1-x}Al_xCN$ layer (where $0.7 \leq x \leq 0.9$ in the formulas), in which a TiN layer and/or a TiCN layer is a joint layer for a substrate body made of cemented carbide, cermet, or ceramic, the $Ti_{1-x}Al_xN$ layer and/or the $Ti_{1-x}Al_xCN$ layer contains hexagonal AlN, with 25% or less hexagonal AlN being present.

For example, Japanese Translation of PCT Application No. 2020-506811 discloses a coated cutting tool including a substrate and a coating, the coating including at least one of an inner layer of 4 µm to 14 µm thick $Ti_{1-x}Al_xN$, an intermediate layer of 0.05 µm to 1 µm thick TiCN, and an outer layer of 1 µm to 9 µm thick $\alpha$-$Al_2O_3$, in which the $\alpha$-$Al_2O_3$ layer exhibits an X-ray diffraction pattern, in a case of measuring using CuK$\alpha$ rays and theta-2 theta scan, and the texture coefficient TC (h, k, l) is defined according to Harris formula $$TC(hkl) = \frac{I(hkl)}{I0(hkl)} \left[ \frac{1}{n} \sum_{i=0}^{n} \frac{I(hkl)}{I0(hkl)} \right]^{-1}$$

where, in the formula, the (h, k, l) reflections used are (0, 2, 4), (1, 1, 6), (3, 0, 0), and (0, 0, 12), I(h, k, l)=measured intensity (peak intensity) of the (h, k, l) reflection, I0(h, k, l)=standard intensity according to ICDD PDF Card No. 00-042-1468, n=number of reflections used in calculation, and 3<TC(0, 0, 12)<4.

SUMMARY

Technical Problem

The demand in recent years for work conservation and energy conservation in cutting is great, and thus cutting is in an increasingly high-speed and high-efficiency trend. Accordingly, wear resistance is demanded of coated cutting tools even more, and also excellent chipping resistance and fracture resistance over prolonged periods of use are demanded.

Japanese Translation of PCT Application No. 2011-516722 discloses using an object coated with a hard material containing an $Al_2O_3$ layer, but no consideration whatsoever is given to the properties of the $Al_2O_3$ layer.

Accordingly, object coated with the hard material disclosed in Japanese Translation of PCT Application No. 2011-516722 has insufficient wear resistance and fracture resistance, and there is room for improvement.

The coated cutting tool disclosed in Japanese Translation of PCT Application No. 2020-506811 gives consideration to the orientation of an $\alpha$-$Al_2O_3$ layer, regard to which point crater wear resistance is improved. However, the coated cutting tool disclosed in Japanese Translation of PCT Application No. 2020-506811 gives no consideration to the grain size of the $\alpha$-$Al_2O_3$ layer, and accordingly there are cases in which chipping occurs due to particle drop-out and thus fracture resistance is insufficient and there is room for improvement.

The present invention has been made in light of the foregoing circumstances, and accordingly, an object thereof is to provide a coated cutting tool which has excellent wear resistance and fracture resistance and which accordingly allows for an extended tool life.

Solution to Problem

The present inventor has undertaken research regarding extending the tool life of coated cutting tools from the perspective described above. As a result, it has been found that by the coating layer of the coated cutting tool including a lower layer containing a compound layer of a particular composition and an upper layer containing an $\alpha$-$Al_2O_3$ layer, in this order, and controlling grain size distribution of grains within the $\alpha$-$Al_2O_3$ layer to a particular range, occurrence of chipping due to particle drop-out of the $\alpha$-$Al_2O_3$ layer can be suppressed, whereby not only is wear resistance improved but also fracture resistance is improved in particular, and consequently the tool life of the coated cutting tool can be extended, and has completed the present invention.

That is to say, the essence of the present invention is as follows.

[1] A coated cutting tool, including a substrate and a coating layer formed on a surface of the substrate, wherein
the coating layer includes a lower layer and an upper layer in this order from a substrate side toward a surface side of the coating layer, and the upper layer is formed on a surface of the lower layer,
the lower layer contains a compound having a composition represented by Formula (1) below $$(Al_xTi_{1-x})N \quad (1)$$

where, in Formula (1), x represents an atomic ratio of an Al element to a sum of the Al element and a Ti element, and $0.70 \leq x \leq 0.90$ is satisfied,
an average thickness of the lower layer is 1.0 µm or more and 15.0 µm or less, the upper layer contains an α-Al₂O₃ layer containing α-Al₂O₃, an average thickness of the upper layer is 0.5 μm or more and 15.0 μm or less, and in grains of the α-Al₂O₃ layer, a proportion of grains of which a grain size is 0.05 μm or more and less than 0.5 μm is 50% by area or more and 80% by area or less.

[2] The coated cutting tool according to [1], wherein in the grains of the α-Al₂O₃ layer, a proportion of grains of which the grain size is 0.5 μm or more and less than 1.0 μm is 10% by area and more to 50% by area or less.

[3] The coated cutting tool according to [1] or [2], wherein in the grains of the α-Al₂O₃ layer, a proportion of grains of which the grain size is 1.0 μm or more and 3.0 μm or less is 0% by area or more and 10% by area or less.

[4] The coated cutting tool according to any one of [1] to [3], wherein, in the upper layer, a proportion of length of a Σ3 grain boundary to 100% of a total length of all grain boundaries is 0% or more and 10% or less.

[5] The coated cutting tool according to any one of [1] to [4], wherein an average thickness of the entire coating layer is 2.0 μm or more and 20.0 μm or less.

[6] The coated cutting tool according to any one of [1] to [5], wherein the substrate is any of a cemented carbide, a cermet, a ceramic, or a cubic boron nitride sintered body.

Advantageous Effects of Invention

The present invention can provide a coated cutting tool which has excellent wear resistance and fracture resistance, and which accordingly allows for an extended tool life.

BRIEF DESCRIPTION OF DRAWINGS

FIGURE is a schematic view showing an example of a coated cutting tool according to the present invention.

DETAILED DESCRIPTION

An embodiment for carrying out the present invention (hereinafter, simply referred to as the "present embodiment") will hereinafter be described in detail with reference to the attached drawings as appropriate, but the present invention is not limited to the following present embodiment. Various modifications may be made to the present invention without departing from the gist of the invention. In addition, in the drawings, unless otherwise specified, positional relationships, such as vertical and horizontal relationships, are presumed to be based on the positional relationships illustrated in the drawings. Further, the dimensional ratios of the drawings are not limited to those illustrated therein.

A coated cutting tool according to the present embodiment includes a substrate, and a coating layer formed on a surface of the substrate. The coating layer includes a lower layer and an upper layer in this order from the substrate side toward the surface side of the coating layer. The upper layer is formed on a surface of the lower layer, the lower layer contains a compound having a composition represented by the following Formula (1)

$$(Al_xTi_{1-x})N \qquad (1)$$

where, in Formula (1), x represents an atomic ratio of Al element to a sum of Al element and Ti element, and 0.70≤x≤0.90 is satisfied, an average thickness of the lower layer is 1.0 μm or more to 15.0 μm or less, the upper layer contains an α-Al₂O₃ layer containing α-Al₂O₃, an average thickness of the upper layer is 0.5 μm or more to 15.0 μm or less, and in the grains of the α-Al₂O₃ layer, the proportion of grains of which the grain size is 0.05 μm or more to less than 0.5 μm is 50% by area or more to 80% by area or less.

Due to having the above configuration, wear resistance and fracture resistance of the coated cutting tool according to the present embodiment can be improved, and as a result, tool life can be extended. The factors of improved wear resistance and fracture resistance of the coated cutting tool according to the present embodiment can be thought as follows. It should be noted, however, that the present invention is not limited by the following factors in any way. That is to say, in the coated cutting tool according to the present embodiment, the coating layer includes the lower layer and the upper layer in this order from the substrate side toward the surface side of the coating layer, with the upper layer formed on the surface of the lower layer, and the lower layer containing a compound having a composition represented by the above Formula (1). When the atomic ratio x of the Al element in the above Formula (1) is 0.70 or more, the hardness of the coating layer improves due to solid solution strengthening, and thus wear resistance is improved, and also oxidation resistance improves due to increased Al content. As a result, the coated cutting tool according to the present embodiment has improved crater wear resistance, and accordingly fracture resistance is improved by suppressing deterioration in strength of the cutting edge. Also, when the atomic ratio x of the Al element in the above Formula (1) is 0.90 or less, the toughness of the coating layer improves due to containing Ti, and accordingly occurrence of thermal cracking can be suppressed. As a result, the fracture resistance of the coated cutting tool according to the present embodiment is improved. Also, the wear resistance of the coated cutting tool according to the present embodiment improves by the average thickness of the lower layer being 1.0 μm or more. Conversely, by the average thickness of the lower layer being 15.0 μm or less, in the coated cutting tool according to the present embodiment, adhesion to the substrate (e.g., cemented carbide) improves, and occurrence of thermal cracking can be suppressed, thereby improving fracture resistance. Also, the upper layer of the coated cutting tool according to the present embodiment contains an α-Al₂O₃ layer containing α-Al₂O₃ and thus is hard, thereby improving wear resistance. Also, when the average thickness of the upper layer is 0.5 μm or more, crater wear resistance of the coated cutting tool is improved. Conversely, when the average thickness of the upper layer is 15.0 μm or less, coarsening of grain size can be suppressed, and accordingly occurrence of fracturing due to chipping can be suppressed. As a result, the fracture resistance of the coated cutting tool according to the present embodiment is improved. Also, in the grains of the α-Al₂O₃ layer of the coated cutting tool according to the present embodiment, due to the proportion of grains of which the grain size being 0.05 μm or more to less than 0.5 μm is 50% by area or more, the proportion of coarse grains of which the grain size is 0.5 μm or more decreases, and accordingly occurrence of fracturing due to chipping can be suppressed. As a result, the fracture resistance of the coated cutting tool according to the present embodiment is improved. Conversely, in the grains of the α-Al₂O₃ layer of the coated cutting tool according to the present embodiment, when the proportion of grains of which the grain size is 0.05 μm or more to less than 0.5 μm is 80% by area or less, manufacturing is facilitated.

It is thought that by combining these configurations, the wear resistance and fracture resistance of the coated cutting tool according to the present embodiment are improved, and as a result, the tool life can be prolonged.

FIGURE is a cross-sectional schematic diagram illustrating an example of the coated cutting tool according to the present embodiment. The coated cutting tool 5 includes a substrate 1 and a coating layer 4 formed on the surface of the substrate 1. In the coating layer 4, a lower layer 2 and an upper layer 3 are stacked upward in this order (from the substrate side to the surface side of the coating layer).

The coated cutting tool according to the present embodiment includes the substrate and the coating layer formed on the surface of the substrate. Specific examples of the type of the coated cutting tool include an interchangeable cutting insert for milling or turning, a drill, and an end mill.

The substrate that is used in the present embodiment is not particularly limited as long as it may be used as a substrate for a coated cutting tool. Examples of such a substrate include a cemented carbide, a cermet, a ceramic, a cubic boron nitride sintered body, a diamond sintered body, and high-speed steel. Among these, the substrate is preferably one of a cemented carbide, a cermet, a ceramic or a cubic boron nitride sintered body, because more excellent wear resistance and fracture resistance can be realized, and from the same perspective, the substrate is more preferably a cemented carbide.

Note that the surface of the substrate may be modified. For example, in a case in which the substrate is made of a cemented carbide, a β-free layer may be formed on the surface thereof. Also, in a case in which the substrate is made of a cermet, a hardened layer may be formed on the surface thereof. The functions and effects of the present invention can be obtained even when the surface of the substrate is modified thusly.

The coating layer used in the present embodiment preferably has an average thickness of 2.0 μm or more and 20.0 μm or less, thereby improving wear resistance. When the average thickness of the entire coating layer is 2.0 μm or more, the wear resistance of the coated cutting tool according to the present embodiment is improved, and when the average thickness of the entire coating layer is 20.0 μm or less, fracture resistance is improved primarily due to suppression of peeling of the coating layer. From the same viewpoint, the average thickness of the coating layer used in the present embodiment is more preferably 2.5 μm or more to 19.5 μm or less, and even more preferably 2.9 μm or more to 19.0 μm or less.

Note that the average thickness of each layer and the entire coating layer of the coated cutting tool according to the present embodiment can be obtained by measuring the thickness of each layer or the thickness of the entire coating layer from cross sections in three or more locations of each layer or the entire coating layer, and calculating the arithmetic mean value.

Lower Layer

The lower layer used in the present embodiment contains a compound having a composition represented by the following Formula (1)

$(Al_xTi_{1-x})N$ (1)

where, in Formula (1), x represents an atomic ratio of Al element to a sum of Al element and Ti element, and $0.70 \leq x \leq 0.90$ is satisfied.

By being provided with such a lower layer between the substrate and the upper layer, the wear resistance and the adhesion of the coated cutting tool according to the present embodiment are improved.

When the atomic ratio x of the Al element in the above Formula (1) is 0.70 or more, the hardness of the coating layer improves due to solid solution strengthening, and thus wear resistance is improved, and also oxidation resistance improves due to increased Al content. As a result, the coated cutting tool according to the present embodiment has improved crater wear resistance, and accordingly fracture resistance is improved by suppressing deterioration in strength of the cutting edge. Also, when the atomic ratio x of the Al element in the above Formula (1) is 0.90 or less, the toughness of the coating layer improves due to containing Ti, and accordingly occurrence of thermal cracking can be suppressed. As a result, the fracture resistance of the coated cutting tool according to the present embodiment is improved. From the same perspective, the atomic ratio x of the Al element in the above Formula (1) is preferably 0.72 or more, and 0.89 or less.

Note that in the coated cutting tool according to the present embodiment, when the composition of the coating layer is written as $(Al_{0.80}Ti_{0.20})N$ for example, this represents that the atomic ratio of the Al element to the sum of the Al element and the Ti element is 0.80, and the atomic ratio of the Ti element to the sum of the Al element and the Ti element is 0.20. That is to say, this means that the atomic percentage of the Al element as to the sum of the Al element and the Ti element is 80 at. %, and the atomic percentage of the Ti element as to the sum of the Al element and the Ti element is 20 at. %.

It is sufficient in the present embodiment for the lower layer to contain the compound having the composition represented by the above Formula (1), and may or may not contain components other than the compound having the composition represented by the above Formula (1), as long as the operational effect of the present invention is exhibited.

The average thickness of the lower layer used in the present embodiment is 1.0 μm or more to 15.0 μm or less. The wear resistance of the coated cutting tool according to the present embodiment improves by the average thickness of the lower layer being 1.0 μm or more. Conversely, by the average thickness of the lower layer being 15.0 μm or less, in the coated cutting tool according to the present embodiment, adhesion to the substrate (e.g., cemented carbide) improves, and occurrence of thermal cracking can be suppressed, thereby improving fracture resistance. From the same perspective, the average thickness of the lower layer is preferably 1.2 μm or more to 13.0 μm or less, and more preferably is 1.5 μm or more to 12.5 μm or less.

Upper Layer

The upper layer used in the present embodiment contains an $\alpha$-$Al_2O_3$ layer containing $\alpha$-$Al_2O_3$. Due to the upper layer having the $\alpha$-$Al_2O_3$ layer containing $\alpha$-$Al_2O_3$, the coated cutting tool according to the present embodiment is hard, and accordingly wear resistance is improved.

Also, the average thickness of the upper layer of the coated cutting tool according to the present embodiment is 0.5 μm or more to 15.0 μm or less. When the average thickness of the upper layer is 0.5 μm or more, crater wear resistance of the coated cutting tool is improved. Conversely, when the average thickness of the upper layer is 15.0 μm or less, coarsening of grain size can be suppressed, and accordingly occurrence of fracturing due to chipping can be suppressed. As a result, the fracture resistance of the coated cutting tool according to the present embodiment is improved. From the same perspective, the average thickness of the upper layer is preferably 0.6 µm or more to 14.0 µm or less, and more preferably is 0.7 µm or more to 13.2 µm or less.

Also, in the grains of the α-$Al_2O_3$ layer of the coated cutting tool according to the present embodiment, the proportion of grains of which the grain size is 0.05 µm or more to less than 0.5 µm is 50% by area or more to 80% by area or less. Due to the proportion of grains of which the grain size is 0.05 µm or more to less than 0.5 µm being 50% by area or more in the grains of the α-$Al_2O_3$ layer, the proportion of coarse grains of which the grain size is 0.5 µm or more decreases, and accordingly occurrence of fracture due to chipping can be suppressed. As a result, the fracture resistance of the coated cutting tool according to the present embodiment is improved. Conversely, in the grains of the α-$Al_2O_3$ layer of the coated cutting tool according to the present embodiment, when the proportion of grains of which the grain size is 0.05 µm or more to less than 0.5 µm is 80% by area or less, manufacturing is facilitated. From the same perspective, in the grains of the α-$Al_2O_3$ layer, the proportion of grains of which the grain size is 0.05 µm or more to less than 0.5 µm preferably is 51% by area or more and 79% by area or less, and more preferably 52% by area or more and 79% by area or less.

Also, in the grains of the α-$Al_2O_3$ layer of the coated cutting tool according to the present embodiment, the proportion of grains of which the grain size is 0.5 µm or more to less than 1.0 µm preferably is 10% by area or more to 50% by area or less. Due to the proportion of grains of which the grain size is 0.5 µm or more to less than 1.0 µm being 50% by area or less in the grains of the α-$Al_2O_3$ layer, the proportion of coarse grains of which the grain size is 0.5 µm or more decreases, and accordingly occurrence of fracture due to chipping tends to be able to be suppressed. As a result, the fracture resistance of the coated cutting tool according to the present embodiment tends to improve. Conversely, in the grains of the α-$Al_2O_3$ layer of the coated cutting tool according to the present embodiment, when the proportion of grains of which the grain size is 0.5 µm or more to less than 1.0 µm is 10% by area or more, manufacturing is facilitated. From the same perspective, in the grains of the cl-$Al_2O_3$ layer, the proportion of grains of which the grain size is 0.5 µm or more to less than 1.0 µm preferably is 15% by area or more and 48% by area or less, and more preferably 21% by area or more and 46% by area or less.

Also, in the grains of the α-$Al_2O_3$ layer of the coated cutting tool according to the present embodiment, the proportion of grains of which the grain size is 1.0 µm or more to 3.0 µm or less preferably is 0% by area or more to 10% by area or less. Due to the proportion of grains of which the grain size is 1.0 µm or more to 3.0 µm or less being 10% by area or less in the grains of the α-$Al_2O_3$ layer, occurrence of fracture due to chipping tends to be able to be suppressed. As a result, the fracture resistance of the coated cutting tool according to the present embodiment tends to improve. From the same perspective, in the grains of the α-$Al_2O_3$ layer, the proportion of grains of which the grain size is 1.0 µm or more to 3.0 µm or less preferably is 9% by area or less, and more preferably 8% by area or less.

Note that in the present embodiment, the grain size of grains in the α-$Al_2O_3$ layer can be measured by a method described in later-described Examples.

Also, in the upper layer of the coated cutting tool according to the present embodiment, a proportion of length of a Σ3 grain boundary to 100% of a total length of all grain boundaries is preferably 0% or more to 10% or less. When the proportion of the length of the Σ3 grain boundary to 100% of the total length of all grain boundaries is 10% or less, the proportion of random grain boundaries having relatively high grain boundary energy increases, and accordingly nucleation at the grain boundaries of the α-$Al_2O_3$ layer is facilitated, and so the proportion of minute crystals tends to increase. Note that in the present embodiment, the total length of all grain boundaries is a length obtained by adding the length of a CSL grain boundary to the lengths of other common crystal grain boundaries. From the same perspective, in the upper layer, the proportion of length of the Σ3 grain boundary to 100% of the total length of all grain boundaries more preferably is 1% or more to 10% or less.

The upper layer used in the present embodiment has crystal grain boundaries of which the grain boundary energy is relatively high, and crystal grain boundaries of which the grain boundary energy is relatively low. Normally, the array of atoms at crystal grain boundaries is a random array, irregular and disorderly, and accordingly there are many gaps and the grain boundary energy thereat is relatively high. Conversely, there are crystal grain boundaries at which the array of atoms is orderly and there are few gaps at the grain boundary, and such crystal grain boundaries have relatively low grain boundary energy. A representative example of such crystal grain boundaries having relatively low grain boundary energy is coincidence site lattice crystal grain boundary (hereinafter referred to as "CSL crystal grain boundary" and also as "CSL grain boundary"). Crystal grain boundaries have significant effects on important sintering processes such as densification, creep, and diffusion, in the same way as with regard to electrical, optical, and mechanical properties. The importance of crystal grain boundaries depends on several factors, such as for example, crystal grain boundary density in matter, chemical composition of interface, and crystallographic composition, i.e., crystal grain boundary plane orientation and crystal grain misorientation. The CSL crystal grain boundary plays a special role. The Σ value is known as an index that indicates the degree of distribution of the CSL crystal grain boundary, and is defined as a ratio between a density of crystal lattice points of two crystal grains in contact with each other at a crystal grain boundary and a density of lattice points coinciding with each other when the crystal lattices thereof are overlaid on each other. It generally is found that, in a case of a simple structure, a grain boundary having a low Σ value tends to have low interface energy and special properties. Accordingly, control of the proportion of CLS crystal grain boundaries and distribution of crystal grain misorientation is considered to be important for properties of the upper layer and improvement thereof.

Technology based on a scanning electron microscope (hereinafter also referred to as SEM) known as electron backscatter diffraction (hereinafter also referred to as EBSD) has come into use in recent years in research of crystal grain boundaries in matter. EBSD is based on automatic analysis of a Kikuchi diffraction pattern generated by backscattered electrons.

The crystallographic orientation of each crystal grain of the matter that is the object is determined after indexing a corresponding diffraction pattern. Using EBSD along with commercially-available software enables texture analysis and grain boundary character distribution (GBCD) to be determined relatively easily. Measuring and analyzing interfaces by EBSD enables misorientation of crystal grain boundaries to be found in sample groups with large interfaces. Normally, distribution of misorientation relates to processing and/or physical properties of the matter. Crystal grain boundary misorientation can be obtained from common orientation parameters such as Euler angle, angle/axis pair, Rodrigues vector, and so forth.

In the present embodiment, the term CSL crystal grain boundary of the upper layer refers to not only the Σ3 grain boundary, but also the Σ7 grain boundary, the Σ11 grain boundary, the Σ13 grain boundary the Σ17 grain boundary, the Σ19 grain boundary, the Σ21 grain boundary, the Σ23 grain boundary, and the Σ29 grain boundary. The Σ3 grain boundary is thought to have the lowest grain boundary energy out of the CSL crystal grain boundaries in the upper layer. The length of the Σ3 grain boundary here means the total length of the Σ3 grain boundary in a field of view observed with an SEM equipped with EBSD (within a particular range). This Σ3 grain boundary has high coincidence site lattice point density, and lower grain boundary energy as compared to other CSL crystal grain boundaries. In other words, the Σ3 grain boundary is a CSL crystal grain boundary with many coinciding lattice points, and two crystal grains that share a Σ3 grain boundary as the grain boundary therebetween exhibit behavior close to monocrystal or twin crystal behavior, and exhibit a tendency for the size of the crystal grains to be larger. In the coated cutting tool according to the present embodiment, the proportion of the length of the Σ3 grain boundary to 100% of the total length of CSL grain boundary is made to be small in the upper layer, whereby the proportion of random grain boundaries having relatively high grain boundary energy increases, and accordingly nucleation in grain boundaries in the α-Al$_2$O$_3$ layer is facilitated, whereby the proportion of minute crystals tends to increase.

Now, the term "all grain boundaries" here refers to a total of the CSL crystal grain boundary and crystal grain boundaries other than the CSL crystal grain boundary. The crystal grain boundaries other than the CSL crystal grain boundary will be referred to hereinafter as "general crystal grain boundary". The general crystal grain boundary is the remainder grain boundary from excluding the CSL crystal grain boundary from all grain boundaries of crystal grains in the upper layer in a case of observation with an SEM equipped with EBSD. Accordingly, the "total length of all grain boundaries" can be expressed as the "sum of the length of the CSL crystal grain boundary and the length of the general crystal grain boundary."

In the present embodiment, the proportion of the length of the Σ3 grain boundary to 100% of the total length of all grain boundaries in the upper layer, and the proportion of the length of the Σ3 grain boundary to 100% of the total length of the CSL grain boundary can be calculated as follows.

In the coated cutting tool, an observation face is obtained by exposing a cross-section of the upper layer in a direction parallel to the surface of the substrate. An example of a method of exposing the cross-section of the upper layer includes cutting and polishing. Of these, polishing is preferable from the perspective of making the observation face of the upper layer smoother. In particular, the observation face is preferably a mirror-polished surface from the perspective of making to be even smoother. Although not limited in particular, examples of obtaining a mirror-polished observation face of the upper layer include a method of polishing using a diamond paste or colloidal silica, ion milling, and so forth.

Thereafter, the above-described observation face is observed by an SEM equipped with EBSD. For this observation region, observing a smooth face (the flank, etc.) is preferable.

The SEM used is an SU6600 (manufactured by Hitachi High-Tech Corporation), equipped with EBSD (manufactured by TexSEM Laboratories).

A normal line to an observation surface is inclined by 70° with respect to an incident beam, and analysis is conducted by irradiation by an electron beam at a 15 kV acceleration voltage and a 1.0 nA irradiation current. Data is collected stepwise on the observation surface at 0.05 μm/step, for 1000×600 points corresponding to a plane region of 50 μm×30 μm of the upper layer. This data collection is performed for five field-of-view plane areas (50 μm×30 μm of the upper layer), and an average value thereof is calculated.

Data processing is performed using commercially-available software. CSL crystal grain boundaries are counted corresponding to an optional Σ value, and confirmation can be made by representing the proportion of each grain boundary as a ratio to all crystal grain boundaries. From the above, the length of the Σ3 grain boundary, the length of the CSL grain boundary, and the total length of all grain boundaries can be found, and the proportion of the length of the Σ3 grain boundary to 100% of the total length of all grain boundaries can be calculated.

Note that it is sufficient for the upper layer to contain α-type aluminum oxide (α-Al$_2$O$_3$), and may or may not contain components other than α-type aluminum oxide (α-Al$_2$O$_3$), as long as the operational effect of the present invention is exhibited in the present embodiment.

In the coated cutting tool according to the present embodiment, the layers configuring the coating layer may be formed by chemical vapor deposition, or may be formed by physical vapor deposition. The following method is a specific example of a method of forming the layers, for example. Note however, that the formation method of the layers is not limited to this.

Chemical Vapor Deposition

First, the lower layer is formed on the surface of the substrate by chemical vapor deposition. Next, the upper layer is formed on the surface of the lower layer by chemical vapor deposition.

Lower Layer Forming Process

The lower layer can be formed by chemical vapor deposition at a temperature of 700° C. to 900° C. and a pressure of 3 hPa to 5 hPa, using a raw material composition of 0.2 mol % to 0.5 mol % of TiCl$_4$, 0.5 mol % to 2.0 mol % of AlCl$_3$, 2.0 mol % to 5.0 mol % of NH$_3$, and the balance H$_2$.

In order to control the composition of the lower layer represented in the above Formula (1), the raw material composition in the lower layer forming process can be adjusted as appropriate. More specifically, with regard to the method of controlling the ratio of Ti and Al, for example, when the proportion of the raw materials AlCl$_3$/(AlCl$_3$+TiCl$_4$) is great in the lower layer forming process, the atomic ratio x of the Al element in the composition represented in the above Formula (1) tends to be great. Specifically, by making the proportion of AlCl$_3$/(AlCl$_3$+TiCl$_4$) in the raw material composition to be 0.7 or more and 0.9 or less for example, the atomic ratio x of the Al element in the composition represented in the above Formula (1) tends to be able to be controlled to the above particular range.

Upper Layer Forming Process

As for the upper layer, for example, the α-Al$_2$O$_3$ layer containing α-Al$_2$O$_3$ (hereinafter also referred to simply as "Al$_2$O$_3$ layer") can be formed as follows.

First, nuclei for the α-Al$_2$O$_3$ layer are formed upon the surface of the lower layer (nucleation process). The nucleation process of the α-Al$_2$O$_3$ layer is performed under conditions of a temperature of 750° C. to 850° C. and a pressure of 60 hPa to 80 hPa, using a raw material composition of 1.0 mol % to 2.5 mol % of AlCl3, 0.05 mol % to 2.0 mol % of CO, 1.0 mol % to 3.0 mol % of $CO_2$, 2.0 mol % to 3.0 mol % of HCl, and the balance $H_2$. The duration of the nucleation process is preferably three to seven minutes.

Thereafter, the $\alpha$-$Al_2O_3$ layer is formed by chemical vapor deposition under conditions of a temperature of 750° C. to 850° C. and a pressure of 60 hPa to 80 hPa, using a raw material composition of 1.0 mol % to 2.5 mol % of AlCl3, 2.5 mol % to 4.0 mol % of $CO_2$, 2.0 mol % to 3.0 mol % of HCl, 0.05 mol % to 0.15 mol % of $H_2S$, and the balance $H_2$ (film forming process).

Examples of methods to increase the proportion of grains of which the grain size is 0.05 μm or more to less than 0.5 μm in grains of the cl-$Al_2O_3$ layer of the upper layer include adjusting the temperature as appropriate, adjusting the amount of AlCl3 in the raw material composition as appropriate, and so forth, in the upper layer forming process. Specifically, lowering the temperature in the upper layer forming process, for example, tends to increase the proportion of grains in the $\alpha$-$Al_2O_3$ layer of which the grain size is 0.05 μm or more to less than 0.5 μm, and also reducing the amount of AlCl3 in the raw material composition tends to increase the proportion of grains in the $\alpha$-$Al_2O_3$ layer of which the grain size is 0.05 μm or more to less than 0.5 μm. More specifically, setting the temperature to 750° C. to 850° C. and the amount of AlCl3 in the raw material composition to 1.0 mol % to 2.5 mol % in the upper layer forming process (nucleation process and film forming process), for example, tends to enable controlling the proportion of grains in the $\alpha$-$Al_2O_3$ layer of which the grain size is 0.05 μm or more to less than 0.5 μm to the above particular range.

Also, making the substrate-side layer in contact with the upper layer to be the lower layer containing a compound having the composition $(Al_xTi_{1-x})N$ represented by the above Formula (1) tends to enable controlling the proportion of grains in the $\alpha$-$Al_2O_3$ layer of which the grain size is 0.05 μm or more to less than 0.5 μm to the above particular range. Although the mechanism thereof is not completely understood, the present inventor estimates that the interface between the upper layer and the substrate-side layer that comes into contact with the upper layer has an effect thereon. Specifically, the present inventor estimates that forming a smooth lower layer containing a compound having the composition $(Al_xTi_{1-x})N$ represented by the above Formula (1) as the substrate-side layer that comes into contact with the upper layer facilitates formation of minute grains in the $\alpha$-$Al_2O_3$ layer of the upper layer, which tends to enable controlling the proportion of grains in the $\alpha$-$Al_2O_3$ layer of which the grain size is 0.05 μm or more to less than 0.5 μm to the above particular range. Conversely, making the substrate-side layer in contact with the upper layer to be a layer of acicular particles, such as TiCN, TiAlCNO, or the like, tends to make the grains in the $\alpha$-$Al_2O_3$ layer of the upper layer to become coarser.

Examples of methods to reduce the proportion of grains of which the grain size is 0.5 μm or more (hereinafter also referred to as "coarse grains") in grains of the $\alpha$-$Al_2O_3$ layer in the upper layer include adjusting the temperature as appropriate, adjusting the amount of AlCl3 in the raw material composition as appropriate, and so forth, in the upper layer forming process. Specifically, lowering the temperature in the upper layer forming process, for example, tends to increase the proportion of grains in the $\alpha$-$Al_2O_3$ layer of which the grain size is 0.05 μm or more to less than 0.5 μm, and also reducing the amount of AlCl3 in the raw material composition tends to reduce the proportion of coarse grains in the $\alpha$-$Al_2O_3$ layer. More specifically, setting the temperature to 750° C. to 850° C. and the amount of AlCl3 in the raw material composition to 1.0 mol % to 2.5 mol %, for example, in the upper layer forming process (nucleation process and film forming process) tends to enable reduction of the proportion of coarse grains in the $\alpha$-$Al_2O_3$ layer and controlling the proportion of grains of which the grain size is 0.5 μm or more to less than 1.0 μm and the proportion of grains of which the grain size is 1.0 μm or more to 3.0 μm or less to the above particular range.

Also, making the substrate-side layer in contact with the upper layer to be the lower layer containing a compound having the composition $(Al_xTi_{1-x})N$ represented by the above Formula (1) tends to enable the proportion of coarse grains, in particular the proportion of grains of which the grain size is 1.0 μm or more, to be reduced.

Examples of methods to reduce the proportion of the length of the Σ3 grain boundary to 100% of the total length of all grain boundaries in the upper layer include adjusting the temperature as appropriate, adjusting the amount of AlCl3 in the raw material composition as appropriate, and so forth, in the upper layer forming process. Specifically, lowering the temperature in the upper layer forming process, for example, tends to reduce the proportion of the length of the Σ3 grain boundary to 100% of the total length of all grain boundaries, and also reducing the amount of AlCl3 in the raw material composition tends to reduce the proportion of the length of the Σ3 grain boundary to 100% of the total length of all grain boundaries. More specifically, setting the temperature to 750° C. to 850° C. and the amount of AlCl3 in the raw material composition to 1.0 mol % to 2.5 mol %, for example, in the upper layer forming process (nucleation process and film forming process) tends to enable reduction of the proportion of the length of the Σ3 grain boundary to 100% of the total length of all grain boundaries, and to be controlled to the above particular range.

Also, making the substrate side layer in contact with the upper layer to be the lower layer containing a compound having the composition $(Al_xTi_{1-x})N$ represented by the above Formula (1) tends to enable the proportion of the length of the Σ3 grain boundary to 100% of the total length of all grain boundaries to be reduced.

The thickness of each layer in the coating layer of the coated cutting tool of the present embodiment can be measured by observing the cross-sectional structure of the coated cutting tool using an optical microscope, a scanning electron microscope (SEM), a field-emission SEM (FE-SEM), or the like. Note that the average thickness of each layer of the coated cutting tool of the present embodiment can be found by measuring the thickness of each layer at three or more locations in the vicinity of a position of 50 μm from the edge line of the cutting edge toward the center of the rake face of the coated cutting tool and finding the arithmetic mean value thereof. Also, the composition of each layer in the coating layer can be measured from the cross-sectional structure of the coated cutting tool of the present embodiment using an energy dispersive X-ray spectrometer (EDS), a wavelength dispersive X-ray spectrometer (WDS), or the like.

The coated cutting tool according to the present embodiment is considered to have advantages of extended tool life over the conventional, due to having excellent fracture resistance and wear resistance. Note however, that factors that can extend tool life are not limited to the above.

Examples

Hereinafter, the present invention will be described in more detail with reference to Examples, but the present invention is not limited to these Examples.

As a substrate, a cemented carbide was prepared that was processed to an insert shape according to ISO Standard SEMT13T3, and that had a composition of 87.2% of WC, 12.0% of Co, and 0.9% of $Cr_3C_2$ (% by mass, for the above). This substrate was subjected to round honing on the edge line of the cutting edge with a SiC brush, following which the surface of the substrate was cleansed.

Invention Samples 1 to 18 and Comparative Samples 1 to 9

With regard to invention samples 1 to 18 and comparative samples 1 to 9, after cleaning the surface of the substrate, a coating layer was formed by chemical vapor deposition as follows. First, the substrate was loaded into an external-heating chemical vapor deposition apparatus, and a lower layer having the composition shown in Table 1 was formed on the surface of the substrate under the conditions of the raw material composition, temperature, and pressure shown in Table 2 to obtain the average thickness shown in Table 1. Thereafter, nuclei of an $\alpha$-$Al_2O_3$ layer were formed on the surface of the lower layer under the conditions shown in Table 3. After nucleation of the $\alpha$-$Al_2O_3$ layer, an upper layer having the composition shown in Table 1 was formed on the surface of the lower layer under the conditions of the raw material composition, temperature and pressure shown in Table 4, so as to obtain the average thickness shown in Table 1. Note that no upper layer was formed on the invention sample 9. Thus, coated cutting tools of the invention samples 1 to 18 and the comparative samples 1 to 9 were obtained.

Comparative Samples 10 and 11

With regard to comparative samples 10 and 11, after cleaning the surface of the substrate, a coating layer was formed by chemical vapor deposition as follows. First, the substrate was loaded into an external-heating chemical vapor deposition apparatus, and a lower layer having the composition shown in Table 1 was formed on the surface of the substrate under the conditions of the raw material composition, temperature, and pressure shown in Table 2 to obtain the average thickness shown in Table 1. Thereafter, an intermediate layer having the composition shown in Table 1 was formed on the surface of the lower layer under the conditions of the raw material composition, temperature, and pressure shown in Table 5 to obtain the average thickness shown in Table 1. Next, the surface of the intermediate layer was subjected to oxidization processing for five minutes in a gas composition of 0.5 mol % of $CO_2$ and 99.5 mol % of $H_2$ under the conditions of temperature of 1000° C. and pressure of 60 hPa. Thereafter, nuclei of an $\alpha$-$Al_2O_3$ layer were formed on the surface of the intermediate layer under the conditions shown in Table 3. After nucleation of the $\alpha$-$Al_2O_3$ layer, an upper layer having the composition shown in Table 1 was formed on the surface of the intermediate layer under the conditions of the raw material composition, temperature and pressure shown in Table 4, so as to obtain the average thickness shown in Table 1. Thus, coated cutting tools of the comparative samples 10 and 11 were obtained.

TABLE 1

| | Coating layer | | | | | | | Average thickness of entire |
|---|---|---|---|---|---|---|---|---|
| | Lower layer $(Al_xTi_{1-x})N$ | | Intermediate layer | | Upper layer | | | |
| Sample | Atomic ratio x | Average thickness (µm) | Composition | Average thickness (µm) | Composition | Crystal system | Average thickness (µm) | coating layer (µm) |
| Invention sample 1 | 0.81 | 7.0 | — | — | $Al_2O_3$ | $\alpha$ | 5.0 | 12.0 |
| Invention sample 2 | 0.80 | 7.0 | — | — | $Al_2O_3$ | $\alpha$ | 5.0 | 12.0 |
| Invention sample 3 | 0.80 | 7.0 | — | — | $Al_2O_3$ | $\alpha$ | 5.0 | 12.0 |
| Invention sample 4 | 0.80 | 7.0 | — | — | $Al_2O_3$ | $\alpha$ | 5.0 | 12.0 |
| Invention sample 5 | 0.72 | 7.0 | — | — | $Al_2O_3$ | $\alpha$ | 5.0 | 12.0 |
| Invention sample 6 | 0.89 | 7.0 | — | — | $Al_2O_3$ | $\alpha$ | 5.0 | 12.0 |
| Invention sample 7 | 0.80 | 1.5 | — | — | $Al_2O_3$ | $\alpha$ | 5.0 | 6.5 |
| Invention sample 8 | 0.80 | 12.5 | — | — | $Al_2O_3$ | $\alpha$ | 5.0 | 17.5 |
| Invention sample 9 | 0.80 | 7.0 | — | — | $Al_2O_3$ | $\alpha$ | 0.7 | 7.7 |
| Invention sample 10 | 0.80 | 3.0 | — | — | $Al_2O_3$ | $\alpha$ | 13.2 | 16.2 |
| Invention sample 11 | 0.80 | 7.0 | — | — | $Al_2O_3$ | $\alpha$ | 5.0 | 12.0 |
| Invention sample 12 | 0.80 | 7.0 | — | — | $Al_2O_3$ | $\alpha$ | 5.0 | 12.0 |
| Invention sample 13 | 0.79 | 1.5 | — | — | $Al_2O_3$ | $\alpha$ | 1.4 | 2.9 |
| Invention sample 14 | 0.79 | 9.0 | — | — | $Al_2O_3$ | $\alpha$ | 10.0 | 19.0 |
| Invention sample 15 | 0.85 | 7.0 | — | — | $Al_2O_3$ | $\alpha$ | 5.0 | 12.0 |

TABLE 1-continued

| | Coating layer | | | | | | | |
|---|---|---|---|---|---|---|---|---|
| | Lower layer (Al$_x$Ti$_{1-x}$)N | | Intermediate layer | | Upper layer | | | Average thickness of entire coating layer (μm) |
| Sample | Atomic ratio x | Average thickness (μm) | Composition | Average thickness (μm) | Composition | Crystal system | Average thickness (μm) | |
| Invention sample 16 | 0.76 | 7.0 | — | — | Al$_2$O$_3$ | α | 5.0 | 12.0 |
| Invention sample 17 | 0.81 | 7.0 | — | — | Al$_2$O$_3$ | α | 3.0 | 10.0 |
| Invention sample 18 | 0.81 | 7.0 | — | — | Al$_2$O$_3$ | α | 8.0 | 15.0 |
| Comparative sample 1 | 0.80 | 7.0 | — | — | Al$_2$O$_3$ | α | 5.0 | 12.0 |
| Comparative sample 2 | 0.80 | 7.0 | — | — | Al$_2$O$_3$ | α | 5.0 | 12.0 |
| Comparative sample 3 | 0.65 | 7.0 | — | — | Al$_2$O$_3$ | α | 5.0 | 12.0 |
| Comparative sample 4 | 0.95 | 7.0 | — | — | Al$_2$O$_3$ | α | 5.0 | 12.0 |
| Comparative sample 5 | 0.80 | 0.5 | — | — | Al$_2$O$_3$ | α | 6.0 | 6.5 |
| Comparative sample 6 | 0.80 | 16.0 | — | — | Al$_2$O$_3$ | α | 2.0 | 18.0 |
| Comparative sample 7 | 0.80 | 7.5 | — | — | Al$_2$O$_3$ | α | 0.2 | 7.7 |
| Comparative sample 8 | 0.80 | 1.5 | — | — | Al$_2$O$_3$ | α | 16.5 | 18.0 |
| Comparative sample 9 | 0.80 | 7.0 | — | — | — | — | — | 7.0 |
| Comparative sample 10 | 0.81 | 7.0 | TiCN | 1.0 | Al$_2$O$_3$ | α | 4.0 | 12.0 |
| Comparative sample 11 | 0.81 | 7.0 | TiAlCNO | 0.5 | Al$_2$O$_3$ | α | 4.5 | 12.0 |

Note:
The "—" symbols in the table indicate that no layer is formed.

TABLE 2

| | Lower layer | | | | | | |
|---|---|---|---|---|---|---|---|
| | Temperature | Pressure | Raw material composition (mol %) | | | | AlCl$_3$/ (AlCl$_3$ + TiCl$_4$) |
| Sample | (° C.) | (hPa) | TiCl$_4$ | AlCl$_3$ | NH$_3$ | H$_2$ | |
| Invention sample 1 | 750 | 3.0 | 0.3 | 1.2 | 3.5 | 95.0 | 0.80 |
| Invention sample 2 | 750 | 4.5 | 0.3 | 1.2 | 3.5 | 95.0 | 0.80 |
| Invention sample 3 | 750 | 3.0 | 0.3 | 1.2 | 3.5 | 95.0 | 0.80 |
| Invention sample 4 | 750 | 3.0 | 0.3 | 1.2 | 3.5 | 95.0 | 0.80 |
| Invention sample 5 | 750 | 3.5 | 0.2 | 0.5 | 3.5 | 95.8 | 0.71 |
| Invention sample 6 | 750 | 3.0 | 0.3 | 2.0 | 3.5 | 94.2 | 0.87 |
| Invention sample 7 | 750 | 3.0 | 0.3 | 1.2 | 2.5 | 96.0 | 0.80 |
| Invention sample 8 | 750 | 3.0 | 0.3 | 1.2 | 2.5 | 96.0 | 0.80 |
| Invention sample 9 | 700 | 3.0 | 0.3 | 1.2 | 4.5 | 94.0 | 0.80 |
| Invention sample 10 | 750 | 3.0 | 0.3 | 1.2 | 4.5 | 94.0 | 0.80 |
| Invention sample 11 | 750 | 3.0 | 0.3 | 1.2 | 3.5 | 95.0 | 0.80 |
| Invention sample 12 | 800 | 3.0 | 0.3 | 1.2 | 3.5 | 95.0 | 0.80 |
| Invention sample 13 | 750 | 3.0 | 0.4 | 1.6 | 3.5 | 94.5 | 0.80 |
| Invention sample 14 | 750 | 3.0 | 0.4 | 1.6 | 3.5 | 94.5 | 0.80 |
| Invention sample 15 | 750 | 3.0 | 0.4 | 2.0 | 3.5 | 94.1 | 0.83 |
| Invention sample 16 | 750 | 3.5 | 0.2 | 0.7 | 3.5 | 95.6 | 0.78 |
| Invention sample 17 | 750 | 3.0 | 0.3 | 1.2 | 3.5 | 95.0 | 0.80 |
| Invention sample 18 | 750 | 3.0 | 0.3 | 1.2 | 3.5 | 95.0 | 0.80 |
| Comparative sample 1 | 750 | 4.5 | 0.3 | 1.2 | 3.5 | 95.0 | 0.80 |
| Comparative sample 2 | 750 | 3.0 | 0.3 | 1.2 | 3.5 | 95.0 | 0.80 |
| Comparative sample 3 | 750 | 3.0 | 0.5 | 1.0 | 3.5 | 95.0 | 0.67 |
| Comparative sample 4 | 750 | 3.0 | 0.2 | 2.3 | 3.5 | 94.0 | 0.92 |
| Comparative sample 5 | 750 | 3.0 | 0.3 | 1.2 | 2.5 | 96.0 | 0.80 |
| Comparative sample 6 | 750 | 3.0 | 0.3 | 1.2 | 2.5 | 96.0 | 0.80 |
| Comparative sample 7 | 700 | 3.0 | 0.3 | 1.2 | 4.5 | 94.0 | 0.80 |
| Comparative sample 8 | 750 | 3.0 | 0.3 | 1.2 | 4.5 | 94.0 | 0.80 |

TABLE 2-continued

| | | | Lower layer | | | | |
|---|---|---|---|---|---|---|---|
| | Temperature | Pressure | Raw material composition (mol %) | | | | AlCl$_3$/ (AlCl$_3$ + |
| Sample | (° C.) | (hPa) | TiCl$_4$ | AlCl$_3$ | NH$_3$ | H$_2$ | TiCl$_4$) |
| Comparative sample 9 | 700 | 3.0 | 0.3 | 1.2 | 4.5 | 94.0 | 0.80 |
| Comparative sample 10 | 750 | 3.0 | 0.3 | 1.2 | 3.5 | 95.0 | 0.80 |
| Comparative sample 11 | 750 | 3.0 | 0.3 | 1.2 | 3.5 | 95.0 | 0.80 |

TABLE 3

| | | | Upper layer (nucleation process) | | | | | |
|---|---|---|---|---|---|---|---|---|
| | Temperature | Pressure | Composition of raw materials (mol %) | | | | | Time |
| Sample | (° C.) | (hPa) | AlCl$_3$ | CO | CO$_2$ | HCl | H$_2$ | (minutes) |
| Invention sample 1 | 800 | 70 | 1.8 | 1.0 | 2.0 | 2.5 | 92.7 | 5 |
| Invention sample 2 | 850 | 70 | 2.1 | 1.0 | 2.0 | 2.5 | 92.4 | 5 |
| Invention sample 3 | 750 | 70 | 1.2 | 1.0 | 2.0 | 2.5 | 93.3 | 5 |
| Invention sample 4 | 800 | 70 | 2.5 | 1.0 | 1.5 | 2.5 | 92.5 | 5 |
| Invention sample 5 | 800 | 70 | 1.8 | 1.0 | 1.5 | 3.0 | 92.7 | 5 |
| Invention sample 6 | 800 | 70 | 1.8 | 1.0 | 1.5 | 3.0 | 92.7 | 5 |
| Invention sample 7 | 800 | 60 | 1.8 | 1.0 | 1.5 | 2.5 | 93.2 | 5 |
| Invention sample 8 | 800 | 60 | 1.8 | 1.0 | 1.5 | 2.5 | 93.2 | 5 |
| Invention sample 9 | 750 | 80 | 1.2 | 1.0 | 1.5 | 2.5 | 93.8 | 5 |
| Invention sample 10 | 800 | 80 | 2.1 | 1.0 | 1.5 | 2.5 | 92.9 | 5 |
| Invention sample 11 | 800 | 70 | 1.5 | 1.0 | 1.5 | 2.5 | 93.5 | 5 |
| Invention sample 12 | 850 | 70 | 2.5 | 1.0 | 1.5 | 2.5 | 92.5 | 5 |
| Invention sample 13 | 800 | 70 | 1.8 | 1.5 | 1.5 | 2.5 | 92.7 | 5 |
| Invention sample 14 | 800 | 70 | 1.8 | 1.5 | 1.5 | 2.5 | 92.7 | 5 |
| Invention sample 15 | 800 | 70 | 1.8 | 1.0 | 1.5 | 3.0 | 92.7 | 5 |
| Invention sample 16 | 800 | 70 | 1.8 | 1.0 | 1.5 | 3.0 | 92.7 | 5 |
| Invention sample 17 | 800 | 70 | 1.8 | 1.0 | 2.0 | 2.5 | 92.7 | 5 |
| Invention sample 18 | 800 | 70 | 1.8 | 1.0 | 2.0 | 2.5 | 92.7 | 5 |
| Comparative sample 1 | 850 | 70 | 2.3 | 1.0 | 2.0 | 2.5 | 92.2 | 5 |
| Comparative sample 2 | 900 | 70 | 3.0 | 1.0 | 2.0 | 2.5 | 91.5 | 5 |
| Comparative sample 3 | 800 | 70 | 1.8 | 1.0 | 1.5 | 3.0 | 92.7 | 5 |
| Comparative sample 4 | 800 | 70 | 1.8 | 1.0 | 1.5 | 3.0 | 92.7 | 5 |
| Comparative sample 5 | 800 | 60 | 1.8 | 1.0 | 1.5 | 2.5 | 93.2 | 5 |
| Comparative sample 6 | 800 | 60 | 1.8 | 1.0 | 1.5 | 2.5 | 93.2 | 5 |
| Comparative sample 7 | 750 | 80 | 1.2 | 1.0 | 1.5 | 2.5 | 93.8 | 5 |
| Comparative sample 8 | 800 | 80 | 2.2 | 1.0 | 1.5 | 2.5 | 92.8 | 5 |
| Comparative sample 9 | No upper layer formed | | | | | | | |
| Comparative sample 10 | 800 | 70 | 1.8 | 1.0 | 2.0 | 2.5 | 92.7 | 5 |
| Comparative sample 11 | 800 | 70 | 1.8 | 1.0 | 2.0 | 2.5 | 92.7 | 5 |

TABLE 4

| | | | Upper layer (film forming process) | | | | |
|---|---|---|---|---|---|---|---|
| | Temperature | Pressure | Raw material composition (mol %) | | | | |
| Sample | (° C.) | (hPa) | AlCl$_3$ | CO$_2$ | HCl | H$_2$S | H$_2$ |
| Invention sample 1 | 800 | 70 | 1.8 | 4.0 | 2.5 | 0.10 | 91.6 |
| Invention sample 2 | 850 | 70 | 2.5 | 4.0 | 2.5 | 0.10 | 90.9 |
| Invention sample 3 | 750 | 70 | 1.2 | 4.0 | 2.5 | 0.10 | 92.2 |
| Invention sample 4 | 800 | 70 | 1.8 | 3.0 | 2.5 | 0.10 | 92.6 |
| Invention sample 5 | 800 | 70 | 1.8 | 3.0 | 3.0 | 0.10 | 92.1 |
| Invention sample 6 | 800 | 70 | 1.8 | 3.0 | 3.0 | 0.10 | 92.1 |
| Invention sample 7 | 800 | 60 | 1.8 | 3.0 | 2.5 | 0.10 | 92.6 |
| Invention sample 8 | 800 | 60 | 1.8 | 3.0 | 2.5 | 0.10 | 92.6 |
| Invention sample 9 | 750 | 80 | 1.2 | 3.0 | 2.5 | 0.10 | 93.2 |
| Invention sample 10 | 800 | 80 | 1.8 | 3.0 | 2.5 | 0.10 | 92.6 |
| Invention sample 11 | 800 | 70 | 1.8 | 3.0 | 2.5 | 0.10 | 92.6 |
| Invention sample 12 | 850 | 70 | 1.8 | 3.0 | 2.5 | 0.10 | 92.6 |

TABLE 4-continued

| | Upper layer (film forming process) | | | | | | |
|---|---|---|---|---|---|---|---|
| | Temperature | Pressure | Raw material composition (mol %) | | | | |
| Sample | (° C.) | (hPa) | AlCl$_3$ | CO$_2$ | HCl | H$_2$S | H$_2$ |
| Invention sample 13 | 800 | 70 | 1.8 | 3.0 | 2.5 | 0.15 | 92.55 |
| Invention sample 14 | 800 | 70 | 1.8 | 3.0 | 2.5 | 0.15 | 92.55 |
| Invention sample 15 | 800 | 70 | 1.8 | 3.0 | 3.0 | 0.10 | 92.1 |
| Invention sample 16 | 800 | 70 | 1.8 | 3.0 | 3.0 | 0.10 | 92.1 |
| Invention sample 17 | 800 | 70 | 1.8 | 4.0 | 2.5 | 0.10 | 91.6 |
| Invention sample 18 | 800 | 70 | 1.8 | 4.0 | 2.5 | 0.10 | 91.6 |
| Comparative sample 1 | 850 | 70 | 3.0 | 4.0 | 2.5 | 0.10 | 90.4 |
| Comparative sample 2 | 900 | 70 | 3.0 | 4.0 | 2.5 | 0.10 | 90.4 |
| Comparative sample 3 | 800 | 70 | 1.8 | 3.0 | 3.0 | 0.10 | 92.1 |
| Comparative sample 4 | 800 | 70 | 1.8 | 3.0 | 3.0 | 0.10 | 92.1 |
| Comparative sample 5 | 800 | 60 | 1.8 | 3.0 | 2.5 | 0.10 | 92.6 |
| Comparative sample 6 | 800 | 60 | 1.8 | 3.0 | 2.5 | 0.10 | 92.6 |
| Comparative sample 7 | 750 | 80 | 1.2 | 3.0 | 2.5 | 0.10 | 93.2 |
| Comparative sample 8 | 800 | 80 | 1.8 | 3.0 | 2.5 | 0.10 | 92.6 |
| Comparative sample 9 | | | No upper layer formed | | | | |
| Comparative sample 10 | 800 | 70 | 1.8 | 4.0 | 2.5 | 0.10 | 91.6 |
| Comparative sample 11 | 800 | 70 | 1.8 | 4.0 | 2.5 | 0.10 | 91.6 |

TABLE 5

| | Intermediate layer | | | |
|---|---|---|---|---|
| Sample | Composition | Temperature (° C.) | Pressure (hPa) | Raw material composition (mol %) |
| Comparative sample 10 | TiCN | 850 | 70 | TiCl$_4$: 6.0%, CH$_3$CN: 1.0%, H$_2$: 93.0% |
| Comparative sample 11 | TiAlCNO | 1000 | 100 | TiCl$_4$: 5.0%, AlCl$_3$: 2.5%, CO: 0.8%, N$_2$: 40.0%, HCl: 5.0%, H$_2$: 46.7% |

Average Thickness of Each Layer

The average thickness of each layer of the obtained samples was determined as follows. That is to say, the thickness at three locations in a cross-section in the vicinity of a position of 50 μm from the edge line of the cutting edge of the coated cutting tool toward the center of the rake surface was measured using the FE-SEM, and the arithmetic mean value was taken as the average thickness. The measurement results are shown in Table 1.

Composition of Each Layer

The composition of each layer of the obtained samples was measured using EDS in a cross-section in the vicinity of a position at up to 50 μm from the edge line of the cutting edge of the coated cutting tool toward the center of the rake surface. The measurement results are shown in Table 1.

Length of CSL Grain Boundary and Length of Σ3 Grain Boundary

The length of the CSL grain boundary and the length of the Σ3 grain boundary in the upper layer of the obtained samples were measured as described below. First, the coated cutting tool was polished in a direction parallel to the surface of the substrate, until a cross-section of the upper layer was exposed, thereby obtaining an observation face. Also, the obtained observation face was polished using colloidal silica to obtain a mirror-polished observation face.

Thereafter, the above observation face was observed by an SEM equipped with EBSD. For the observation region, the flank was observed.

The SEM used was an SU6600 (manufactured by Hitachi High-Tech Corporation), equipped with EBSD (manufactured by TexSEM Laboratories).

A normal line to the observation face was inclined by 70° with respect to an incident beam, and analysis was conducted by irradiation by an electron beam at a 15 kV acceleration voltage and a 1.0 nA irradiation current. Data was collected stepwise on the observation surface at 0.05 μm/step, for 1000×600 points corresponding to a plane region of 50 μm×30 μm of the upper layer. This data collection was performed for five field-of-view plane areas (50 μm×30 μm of the upper layer), and the average value thereof was calculated.

Data processing was performed using commercially-available software. CSL crystal grain boundaries were counted corresponding to an optional Σ value, and confirmation was made by representing the proportion of each grain boundary as a ratio as to all crystal grain boundaries. From the above, the length of the Σ3 grain boundary, the length of the CSL grain boundary, and the total length of all grain boundaries were found, and the proportion of the length of the Σ3 grain boundary to 100% of the total length of all grain boundaries was calculated. The results are shown in Table 6.

Grain Size

The grain size of grains in the α-Al$_2$O$_3$ layer of the obtained samples was measured as follows. The coated cutting tool was polished in a direction parallel to the surface of the substrate, until a cross-section of the upper layer was exposed, thereby obtaining an observation face. This observation face was observed by an FE-SEM equipped with EBSD. In a case in which there was misorientation of five degrees or more between adjacent measurement points, that position was defined as a grain boundary. A region surrounded by grain boundaries was defined as one crystal grain. Next, the area of each crystal grain of the grains in the α-Al₂O₃ layer was found, and a diameter of a circle having the same area thereas a taken as the grain size of each crystal grain. The grain size distribution (% by area) was found for each grain size range as to the entire measurement area of 100% by area. The results are shown in Table 6.

ited chipping (0.2 mm or more in width) or fracture, and the number of times of cutting until the tool life was reached was counted. Note that with regard to the number of times of cutting, passing back and forth over the upper face of the cuboid working material (200 mm×150 mm face of working material) several times until the entire face is cut was counted as one time (one pass).

TABLE 6

| Sample | Grain size distribution of upper layer (% by area) | | | Upper layer Length of Σ3 grain boundary/length of all grain boundaries (%) |
|---|---|---|---|---|
| | 0.05 μm or more to less than 0.5 μm | 0.5 μm or more to less than 1.0 μm | 1.0 μm or more to 3.0 μm or less | |
| Invention sample 1 | 70 | 30 | 0 | 4 |
| Invention sample 2 | 52 | 46 | 2 | 5 |
| Invention sample 3 | 79 | 21 | 0 | 2 |
| Invention sample 4 | 68 | 24 | 8 | 4 |
| Invention sample 5 | 71 | 29 | 0 | 4 |
| Invention sample 6 | 69 | 30 | 1 | 3 |
| Invention sample 7 | 71 | 29 | 0 | 4 |
| Invention sample 8 | 70 | 30 | 0 | 4 |
| Invention sample 9 | 76 | 24 | 0 | 2 |
| Invention sample 10 | 67 | 30 | 3 | 4 |
| Invention sample 11 | 71 | 29 | 0 | 1 |
| Invention sample 12 | 62 | 32 | 6 | 10 |
| Invention sample 13 | 72 | 28 | 0 | 4 |
| Invention sample 14 | 68 | 31 | 1 | 4 |
| Invention sample 15 | 70 | 30 | 0 | 4 |
| Invention sample 16 | 69 | 31 | 0 | 3 |
| Invention sample 17 | 71 | 28 | 1 | 4 |
| Invention sample 18 | 69 | 30 | 1 | 4 |
| Comparative sample 1 | 45 | 51 | 4 | 3 |
| Comparative sample 2 | 32 | 54 | 14 | 16 |
| Comparative sample 3 | 70 | 30 | 0 | 5 |
| Comparative sample 4 | 72 | 28 | 0 | 3 |
| Comparative sample 5 | 70 | 30 | 0 | 4 |
| Comparative sample 6 | 73 | 27 | 0 | 4 |
| Comparative sample 7 | | Not measurable | | |
| Comparative sample 8 | 67 | 30 | 3 | 4 |
| Comparative sample 9 | — | — | — | — |
| Comparative sample 10 | 8 | 28 | 64 | 38 |
| Comparative sample 11 | 12 | 32 | 56 | 42 |

Using the obtained invention samples 1 to 18 and comparative samples 1 to 11, cutting tests 1 and 2 were performed under the following conditions. Table 7 shows the results of the cutting tests 1 and 2.

Cutting Test 1: Wear Resistance Test
Work material: SCM400
Work material shape: cuboid of 200 mm×150 mm×80 mm
Cutting speed: 350 m/min
Depth of cut: 2.0 mm
Width of cut: 75 mm
Feed: 0.20 mm/t
Coolant: dry Evaluation items (wear resistance test): the tool life was assumed to have been reached when the width of wear of the flank of the sample reached 0.3 mm or more, and the amount of cutting time until the tool life was reached was measured.

Cutting Test 2: Fracture Resistance Test
Work material: SCM400
Work material shape: cuboid of 200 mm×150 mm×80 mm having six holes 30 mm in diameter
Cutting speed: 160 m/min
Depth of cut: 1.0 mm
Width of cut: 100 mm
Feed: 0.30 mm/t
Coolant: dry Evaluation items (fracture resistance test): the tool life was assumed to have been reached when the sample exhib- With regard to the cutting time until the tool life was reached in the cutting test 1 (wear resistance test), 45 minutes or longer was evaluated as "A", 30 minutes or more to less than 45 minutes as "B", and less than 30 minutes as "C". Also, with regard to the number of times until the tool life was reached in the cutting test 2 (fracture resistance test), eight times or more was evaluated as "A", five times or more to less than eight times as "B", and less than five times as "C". In these evaluations, "A" means superior, "B" means good, and "C" means inferior. An evaluation for "A" or "B" for the cutting time in the cutting test 1 and also an evaluation for "A" or "B" for the number of times in the cutting test 2 means excellent cutting performance. The obtained evaluation results are shown in Table 7.

TABLE 7

| | Wear resistance test Cutting test 1 | | Fracture resistance test Cutting test 2 | |
|---|---|---|---|---|
| Sample | Tool life (minutes) | Evaluation | Tool life (times) | Evaluation |
| Invention sample 1 | 50 | A | 10 | A |
| Invention sample 2 | 46 | A | 5 | B |
| Invention sample 3 | 53 | A | 12 | A |
| Invention sample 4 | 49 | A | 7 | B |
| Invention sample 5 | 46 | A | 8 | A |

TABLE 7-continued

| Sample | Wear resistance test Cutting test 1 | | Fracture resistance test Cutting test 2 | |
|---|---|---|---|---|
| | Tool life (minutes) | Evaluation | Tool life (times) | Evaluation |
| Invention sample 6 | 51 | A | 8 | A |
| Invention sample 7 | 36 | B | 7 | B |
| Invention sample 8 | 64 | A | 7 | B |
| Invention sample 9 | 35 | B | 6 | B |
| Invention sample 10 | 60 | A | 8 | A |
| Invention sample 11 | 52 | A | 10 | A |
| Invention sample 12 | 47 | A | 6 | B |
| Invention sample 13 | 31 | B | 5 | B |
| Invention sample 14 | 68 | A | 5 | B |
| Invention sample 15 | 53 | A | 9 | A |
| Invention sample 16 | 48 | A | 9 | A |
| Invention sample 17 | 44 | B | 7 | B |
| Invention sample 18 | 57 | A | 9 | A |
| Comparative sample 1 | 44 | B | 2 | C |
| Comparative sample 2 | 38 | B | 1 | C |
| Comparative sample 3 | 44 | B | 3 | C |
| Comparative sample 4 | 49 | A | 2 | C |
| Comparative sample 5 | 27 | C | 5 | B |
| Comparative sample 6 | 19 | C | 3 | C |
| Comparative sample 7 | 28 | C | 2 | C |
| Comparative sample 8 | 15 | C | 1 | C |
| Comparative sample 9 | 25 | C | 1 | C |
| Comparative sample 10 | 32 | B | 2 | C |
| Comparative sample 11 | 26 | C | 3 | C |

From the results shown in Table 7, it was found that the evaluation for the cutting time and the evaluation for the number of times of cutting were both "A" or "B" for the invention samples, indicating excellence in both wear resistance and fracture resistance. Conversely, it was found that one or both of the evaluation for the cutting time and the evaluation for the number of times of cutting were "C" for the comparative samples, indicating inferiority in wear resistance and/or fracture resistance as compared to the invention samples.

From the above results, it was found that the invention samples had excellent wear resistance and fracture resistance, and as a result, had a long tool life.

INDUSTRIAL APPLICABILITY

Since the coated cutting tool of the present invention has excellent wear resistance and fracture resistance, the tool life can be extended as compared with the conventional cutting tools, and therefore, from such a viewpoint, the coated cutting tool of the present invention has industrial applicability.

REFERENCE SIGNS LIST

1: substrate, 2: lower layer, 3: upper layer, 4: coating layer, 5: coated cutting tool.

What is claimed is:

1. A coated cutting tool, comprising:
a substrate; and
a coating layer formed on a surface of the substrate, wherein
the coating layer includes a lower layer and an upper layer in this order from a substrate side toward a surface side of the coating layer, and the upper layer is formed on a surface of the lower layer,
the lower layer contains a compound having a composition represented by Formula (1) below $$(Al_xTi_{1-x})N \quad (1)$$

where, in Formula (1), x represents an atomic ratio of an Al element to a sum of the Al element and a Ti element, and $0.70 \leq x \leq 0.90$ is satisfied,
an average thickness of the lower layer is 1.0 μm or more and 15.0 μm or less,
the upper layer contains an α-$Al_2O_3$ layer containing α-$Al_2O_3$,
an average thickness of the upper layer is 0.5 μm or more and 15.0 μm or less, and
in grains of the α-$Al_2O_3$ layer, a proportion of grains of which a grain size is 0.05 μm or more and less than 0.5 μm is 50% by area or more and 80% by area or less.

2. The coated cutting tool according to claim 1, wherein in the grains of the cl-$Al_2O_3$ layer, a proportion of grains of which the grain size is 0.5 μm or more and less than 1.0 μm is 10% by area or more and 50% by area or less.

3. The coated cutting tool according to claim 1, wherein in the grains of the α-$Al_2O_3$ layer, a proportion of grains of which the grain size is 1.0 μm or more and 3.0 μm or less is 0% by area or more and 10% by area or less.

4. The coated cutting tool according to claim 1, wherein, in the upper layer, a proportion of length of a Σ3 grain boundary to 100% of a total length of all grain boundaries is 0% or more and 10% or less.

5. The coated cutting tool according to claim 1, wherein an average thickness of the entire coating layer is 2.0 μm or more and 20.0 μm or less.

6. The coated cutting tool according to claim 1, wherein the substrate is any of a cemented carbide, a cermet, a ceramic, or a cubic boron nitride sintered body.

7. The coated cutting tool according to claim 2, wherein in the grains of the α-$Al_2O_3$ layer, a proportion of grains of which the grain size is 1.0 μm or more and 3.0 μm or less is 0% by area or more and 10% by area or less.

8. The coated cutting tool according to claim 2, wherein, in the upper layer, a proportion of length of a Σ3 grain boundary to 100% of a total length of all grain boundaries is 0% or more and 10% or less.

9. The coated cutting tool according to claim 3, wherein, in the upper layer, a proportion of length of a Σ3 grain boundary to 100% of a total length of all grain boundaries is 0% or more and 10% or less.

10. The coated cutting tool according to claim 7, wherein, in the upper layer, a proportion of length of a Σ3 grain boundary to 100% of a total length of all grain boundaries is 0% or more and 10% or less.

11. The coated cutting tool according to claim 2, wherein an average thickness of the entire coating layer is 2.0 μm or more and 20.0 μm or less.

12. The coated cutting tool according to claim 3, wherein an average thickness of the entire coating layer is 2.0 μm or more and 20.0 μm or less.

13. The coated cutting tool according to claim 4, wherein an average thickness of the entire coating layer is 2.0 μm or more and 20.0 μm or less.

14. The coated cutting tool according to claim 7, wherein an average thickness of the entire coating layer is 2.0 μm or more and 20.0 μm or less.

15. The coated cutting tool according to claim 8, wherein an average thickness of the entire coating layer is 2.0 μm or more and 20.0 μm or less.

16. The coated cutting tool according to claim 9, wherein an average thickness of the entire coating layer is 2.0 μm or more and 20.0 μm or less.

17. The coated cutting tool according to claim 10, wherein an average thickness of the entire coating layer is 2.0 μm or more and 20.0 μm or less.

18. The coated cutting tool according to claim 2, wherein the substrate is any of a cemented carbide, a cermet, a ceramic, or a cubic boron nitride sintered body.

19. The coated cutting tool according to claim 3, wherein the substrate is any of a cemented carbide, a cermet, a ceramic, or a cubic boron nitride sintered body.

20. The coated cutting tool according to claim 4, wherein the substrate is any of a cemented carbide, a cermet, a ceramic, or a cubic boron nitride sintered body.

* * * * *